(12) United States Patent
Kobayashi et al.

(10) Patent No.: US 12,707,173 B2
(45) Date of Patent: Aug. 11, 2026

(54) PHOTOELECTRIC CONVERSION DEVICE, PHOTOELECTRIC CONVERSION SYSTEM, MOVING BODY, AND SEMICONDUCTOR SUBSTRATE

(71) Applicant: CANON KABUSHIKI KAISHA, Tokyo (JP)

(72) Inventors: Hideo Kobayashi, Tokyo (JP); Takanori Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 107 days.

(21) Appl. No.: 18/761,159

(22) Filed: Jul. 1, 2024

(65) Prior Publication Data

US 2024/0357263 A1 Oct. 24, 2024

Related U.S. Application Data

(63) Continuation of application No. PCT/JP2022/000054, filed on Jan. 5, 2022.

(51) Int. Cl.
*H04N 25/78* (2023.01)
*H04N 25/704* (2023.01)
(Continued)

(52) U.S. Cl.
CPC .......... *H04N 25/78* (2023.01); *H04N 25/704* (2023.01); *H10F 39/8063* (2025.01);
(Continued)

(58) Field of Classification Search
CPC ...... H04N 25/78; H04N 25/704; H04N 25/70; H10F 39/809; H10F 39/8063;
(Continued)

(56) References Cited

U.S. PATENT DOCUMENTS 8,717,471 B2 * 5/2014 Sato ...................... H04N 25/78
348/308
8,946,610 B2 2/2015 Iwabuchi
(Continued)

FOREIGN PATENT DOCUMENTS

CN 103681703 A * 3/2014 ............. H04N 25/76
CN 113540135 A * 10/2021 ......... H10F 39/8063
(Continued)

*Primary Examiner* — Lin Ye
*Assistant Examiner* — Steven Daniel Barry
(74) *Attorney, Agent, or Firm* — Canon U.S.A., Inc. IP Division

(57) ABSTRACT

A photoelectric conversion device has a pixel array on which a first pixel to a third pixel are arranged, wherein the first pixel and the second pixel are arranged to be parallel to a first direction, wherein the first pixel is located at a position separated from the second pixel in a positive direction of the first direction, wherein the first pixel is connected to a first signal processing circuit via a first signal line, wherein the second pixel is connected to a second signal processing circuit via a second signal line, wherein the first signal processing circuit and the second signal processing circuit are arranged to be parallel to the first direction, and wherein the first signal processing circuit is located at a position separated from the second signal processing circuit in a direction having a component of a negative direction of the first direction.

16 Claims, 10 Drawing Sheets

(51) Int. Cl.
*H10F 39/00* (2025.01)
*H10W 90/00* (2026.01)

(52) U.S. Cl.
CPC ......... *H10F 39/809* (2025.01); *H10F 39/811* (2025.01); *H10W 90/792* (2026.01)

(58) Field of Classification Search
CPC .... H10F 39/12; H10F 39/811; H10F 39/8057; H01L 24/08; H01L 2224/08145
See application file for complete search history.

(56) References Cited

U.S. PATENT DOCUMENTS

| | | | |
|---|---|---|---|
| 9,423,657 B2* | 8/2016 | Kasahara | G02F 1/134336 |
| 9,842,874 B2 | 12/2017 | Nakata | |
| 10,798,318 B2 | 10/2020 | Izuhara | |
| 11,159,760 B2 | 10/2021 | Kobayashi | |
| 2010/0276572 A1 | 11/2010 | Iwabuchi | |
| 2016/0172399 A1 | 6/2016 | Nakata | |
| 2017/0332030 A1* | 11/2017 | Yin | H10F 39/182 |
| 2019/0104260 A1 | 4/2019 | Izuhara | |
| 2019/0165014 A1* | 5/2019 | Wada | H04N 25/42 |
| 2019/0394407 A1* | 12/2019 | Fukuda | H04N 25/61 |
| 2020/0389617 A1* | 12/2020 | Totsuka | H04N 25/778 |
| 2020/0412992 A1 | 12/2020 | Kobayashi | |

FOREIGN PATENT DOCUMENTS

| | | | | |
|---|---|---|---|---|
| CN | 113853782 A * | 12/2021 | H04N 25/79 |
| JP | 2015026675 A | 2/2015 | |
| JP | 2017183658 A | 10/2017 | |
| JP | 2021005794 A | 1/2021 | |
| WO | 2006129762 A1 | 12/2006 | |
| WO | WO-2018181583 A1 * | 10/2018 | H04N 25/76 |
| WO | WO-2021171795 A1 * | 9/2021 | H04N 25/70 |

* cited by examiner 100
110
10
20
120
140
121
141
122
142
123
143
124
144
125
145
126
146
200
210
220
241
221
242
222
243
240
223
244
224
245
225
246
226

Figure 9:
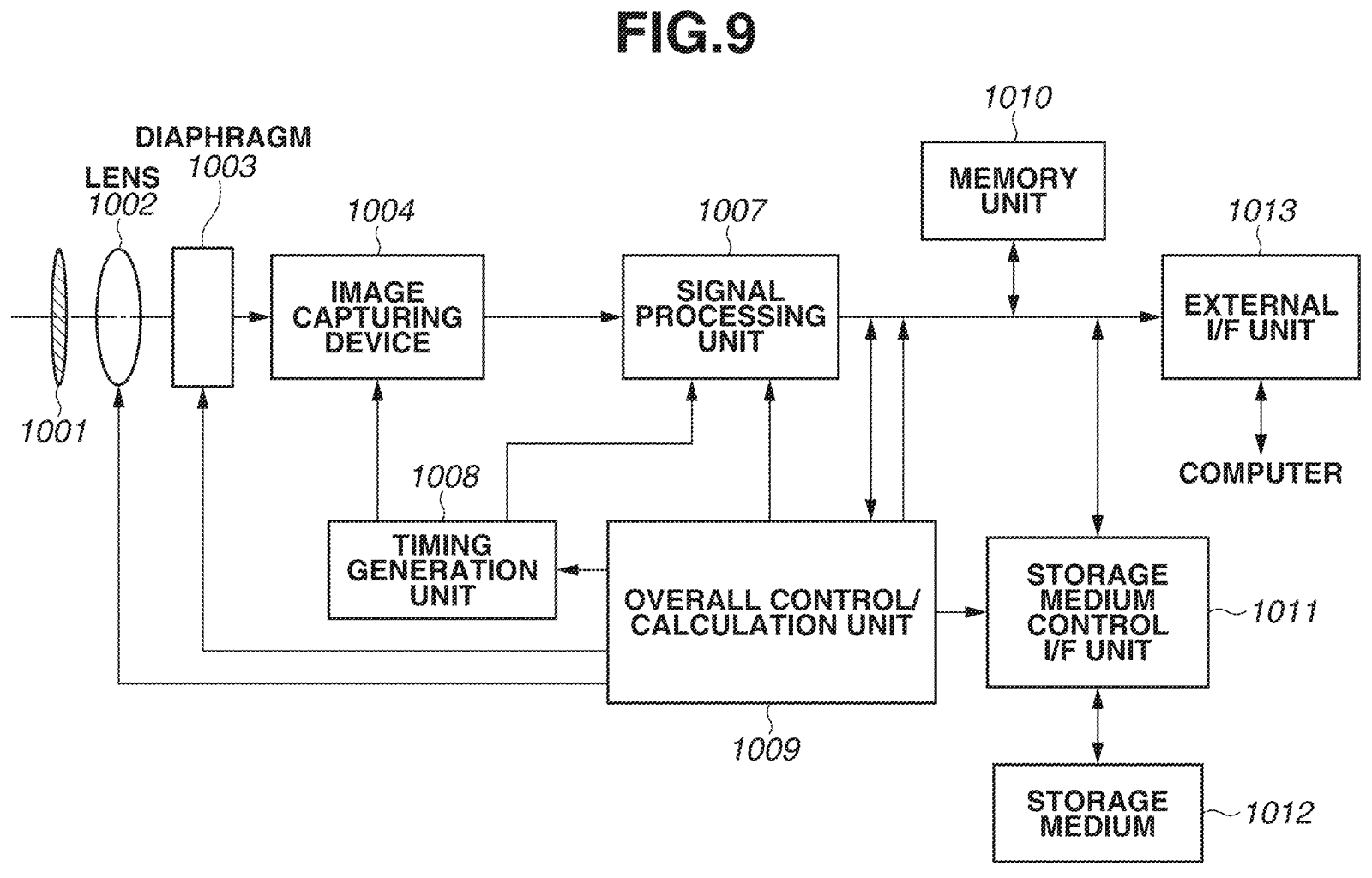

LENS 1002

DIAPHRAGM 1003

IMAGE CAPTURING DEVICE 1004

SIGNAL PROCESSING UNIT 1007

TIMING GENERATION UNIT 1008

OVERALL CONTROL/ CALCULATION UNIT 1009

MEMORY UNIT 1010

STORAGE MEDIUM CONTROL I/F UNIT 1011

STORAGE MEDIUM 1012

EXTERNAL I/F UNIT 1013

COMPUTER

PHOTOELECTRIC CONVERSION DEVICE, PHOTOELECTRIC CONVERSION SYSTEM, MOVING BODY, AND SEMICONDUCTOR SUBSTRATE

CROSS-REFERENCE TO RELATED APPLICATIONS

This application is a Continuation of International Patent Application No. PCT/JP2022/000054, filed Jan. 5, 2022, which is hereby incorporated by reference herein in its entirety.

BACKGROUND OF THE INVENTION

Field of the Invention

The present invention relates to a photoelectric conversion device, and a photoelectric conversion system, a moving body, and a semiconductor substrate which include this photoelectric conversion device.

Background Art

A solid-state imaging device that reads out a pixel signal by using two signal processing circuits is discussed in Patent Literature 1.

CITATION LIST

Patent Literature

PTL 1: Japanese Patent Application Laid-Open No. 2017-183658

SUMMARY OF THE INVENTION

The solid-state imaging device discussed in the Patent Literature 1 has an issue that reading speed is lowered or signal processing becomes complicated when horizontal addition of pixel signals is executed. Particularly, when pixels which output signals used for focus detection are arranged in a pixel array, the issue of the reading speed or complicated signal processing becomes more severe because a load to process the signals used for focus detection is placed on the solid-state imaging device.

The present invention is directed to a technique for suppressing lowering of reading speed or complicatedness of signal processing in a photoelectric conversion device capable of preferably executing analog or digital calculation, which reads out pixel signals by using two signal processing circuits.

According to an aspect of the present invention, a photoelectric conversion device includes a pixel array on which a plurality of pixels including a first pixel, a second pixel, and a third pixel, each of which includes a photoelectric conversion portion, are arranged, wherein at least part of the pixels included in the pixel array are pixels which output signals used for focus detection, each of which includes a photoelectric conversion portion partially shielded from light and arranged with respect to one microlens, wherein, in a planar view the pixel array is viewed from an upper face of the pixel array, the first pixel and the second pixel are arranged to be parallel to a first direction, the first pixel being located at a position separated from a position of the second pixel in a positive direction of the first direction, wherein the first pixel and the third pixel are arranged to be parallel to a second direction, wherein the first pixel and the third pixel are connected to a first signal line, wherein the second pixel is connected to a second signal line, wherein the first signal line is connected to a first signal processing circuit, wherein the second signal line is connected to a second signal processing circuit, and wherein the first signal processing circuit and the second signal processing circuit are arranged to be parallel to the first direction, the first signal processing circuit being located at a position separated from a position of the second signal processing circuit in a direction having a component of a negative direction of the first direction.

According to another aspect of the present invention, a photoelectric conversion device includes a pixel array on which a plurality of pixels including a first pixel, a second pixel, and a third pixel, each of which includes a photoelectric conversion portion, are arranged, wherein at least part of the pixels included in the pixel array have a plurality of photoelectric conversion portions arranged with respect to one microlens, wherein, in a planar view the pixel array is viewed from an upper face of the pixel array, the first pixel and the second pixel are arranged to be parallel to a first direction, the first pixel being located at a position separated from a position of the second pixel in a positive direction of the first direction, wherein the first pixel and the third pixel are arranged to be parallel to a second direction, wherein the first pixel and the third pixel are connected to a first signal line, wherein the second pixel is connected to a second signal line, wherein the first signal line is connected to a first signal processing circuit, wherein the second signal line is connected to a second signal processing circuit, and wherein the first signal processing circuit and the second signal processing circuit are arranged to be parallel to the first direction, the first signal processing circuit being located at a position separated from a position of the second signal processing circuit in a direction having a component of a negative direction of the first direction.

According to yet another aspect of the present invention, a semiconductor substrate laminated with a semiconductor substrate having a pixel array on which a plurality of pixels including a first pixel, a second pixel, and a third pixel, each of which includes a photoelectric conversion portion, are arranged, wherein at least part of the pixels included in the pixel array are pixels which output signals used for focus detection, each of which includes a photoelectric conversion portion partially shielded from light and arranged with respect to one microlens, wherein, in a planar view the pixel array is viewed from an upper face of the pixel array, the first pixel and the second pixel are arranged to be parallel to a first direction, the first pixel being located at a position separated from a position of the second pixel in a positive direction of the first direction, wherein the first pixel and the third pixel are arranged to be parallel to a second direction, wherein the first pixel and the third pixel are connected to a first signal line, wherein the second pixel is connected to a second signal line, wherein the first signal line is connected to a first signal processing circuit, wherein the second signal line is connected to a second signal processing circuit, and wherein the first signal processing circuit and the second signal processing circuit are arranged to be parallel to the first direction, the first signal processing circuit being located at a position separated from a position of the second signal processing circuit in a direction having a component of a negative direction of the first direction.

According to yet another aspect of the present invention, a semiconductor substrate laminated with a semiconductor substrate having a pixel array on which a plurality of pixels including a first pixel, a second pixel, and a third pixel, each of which includes a photoelectric conversion portion, are arranged, wherein at least part of the pixels included in the pixel array have a plurality of photoelectric conversion portions arranged with respect to one microlens, wherein, in a planar view the pixel array is viewed from an upper face of the pixel array, the first pixel and the second pixel are arranged to be parallel to a first direction, the first pixel being located at a position separated from a position of the second pixel in a positive direction of the first direction, wherein the first pixel and the third pixel are arranged to be parallel to a second direction, wherein the first pixel and the third pixel are connected to a first signal line, wherein the second pixel is connected to a second signal line, wherein the first signal line is connected to a first signal processing circuit, wherein the second signal line is connected to a second signal processing circuit, and wherein the first signal processing circuit and the second signal processing circuit are arranged to be parallel to the first direction, the first signal processing circuit being located at a position separated from a position of the second signal processing circuit in a negative direction of the first direction.

According to yet another aspect of the present invention, a semiconductor substrate laminated with a semiconductor substrate having a pixel array on which a plurality of pixels including a first pixel, a second pixel, and a third pixel, each of which includes a photoelectric conversion portion, is arranged, wherein at least part of the pixels included in the pixel array are pixels which output signals used for focus detection, each of which includes a photoelectric conversion portion partially shielded from light and arranged with respect to one microlens, the semiconductor substrate including a first signal processing circuit and a second signal processing circuit, a connection portion the first signal processing circuit is connected to the first pixel via a first signal line, a connection portion the second signal processing circuit is connected to the second pixel via a second signal line, and an intersection portion the first signal line and the second signal line intersect with each other.

According to yet another aspect of the present invention, a semiconductor substrate laminated with a semiconductor substrate having a pixel array on which a plurality of pixels including a first pixel and a second pixel each of which includes a photoelectric conversion portion is arranged, wherein at least part of the pixels included in the pixel array have a plurality of photoelectric conversion portions arranged with respect to one microlens, the semiconductor substrate including a first signal processing circuit and a second signal processing circuit, a connection portion the first signal processing circuit is connected to the first pixel via a first signal line, a connection portion the second signal processing circuit is connected to the second pixel via a second signal line, and an intersection portion the first signal line and the second signal line intersect with each other.

According to yet another aspect of the present invention, a semiconductor substrate laminated with a semiconductor substrate having a pixel array on which a plurality of pixels including a first pixel are arranged and a first signal line connected to the first pixel includes a first signal processing circuit and a second signal line, and a connection portion the first signal processing circuit is connected to the first pixel via the first signal line and the second signal line, wherein the first signal line and the second signal line intersect with each other in a planar view the pixel array is viewed from an upper face of the pixel array.

Further features of the present invention will become apparent from the following description of exemplary embodiments with reference to the attached drawings.

BRIEF DESCRIPTION OF THE DRAWINGS

FIG. 9 is a diagram illustrating a configuration of a photoelectric conversion system according to a fourth exemplary embodiment.

DESCRIPTION OF THE EMBODIMENTS

Hereinafter, exemplary embodiments are described with reference to the appended drawings.

In the following exemplary embodiments, an imaging device is mainly described as an example of the photoelectric conversion device. However, the following exemplary embodiments are applicable not only to the imaging device but also to the other examples of the photoelectric conversion device. For example, the exemplary embodiments are also applicable to a range-finding device (i.e., a distance measurement device employing focus detection and Time-of-Flight (TOF)) and a light measurement device (i.e., a device for measuring an amount of incident light).

First Exemplary Embodiment

Figure 1:
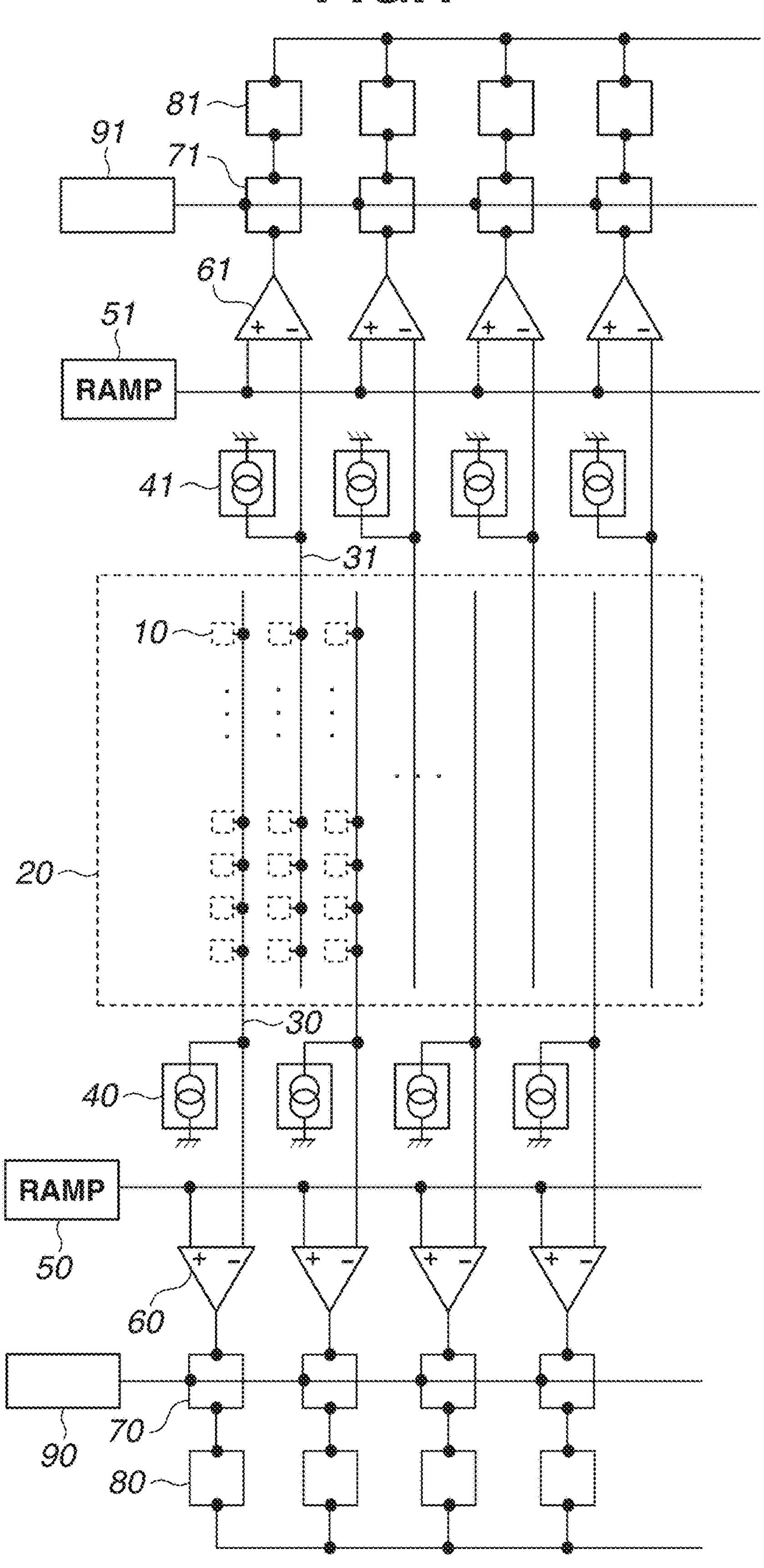
FIG. 1 is a schematic diagram of a photoelectric conversion device according to a first exemplary embodiment.
Figure 2:
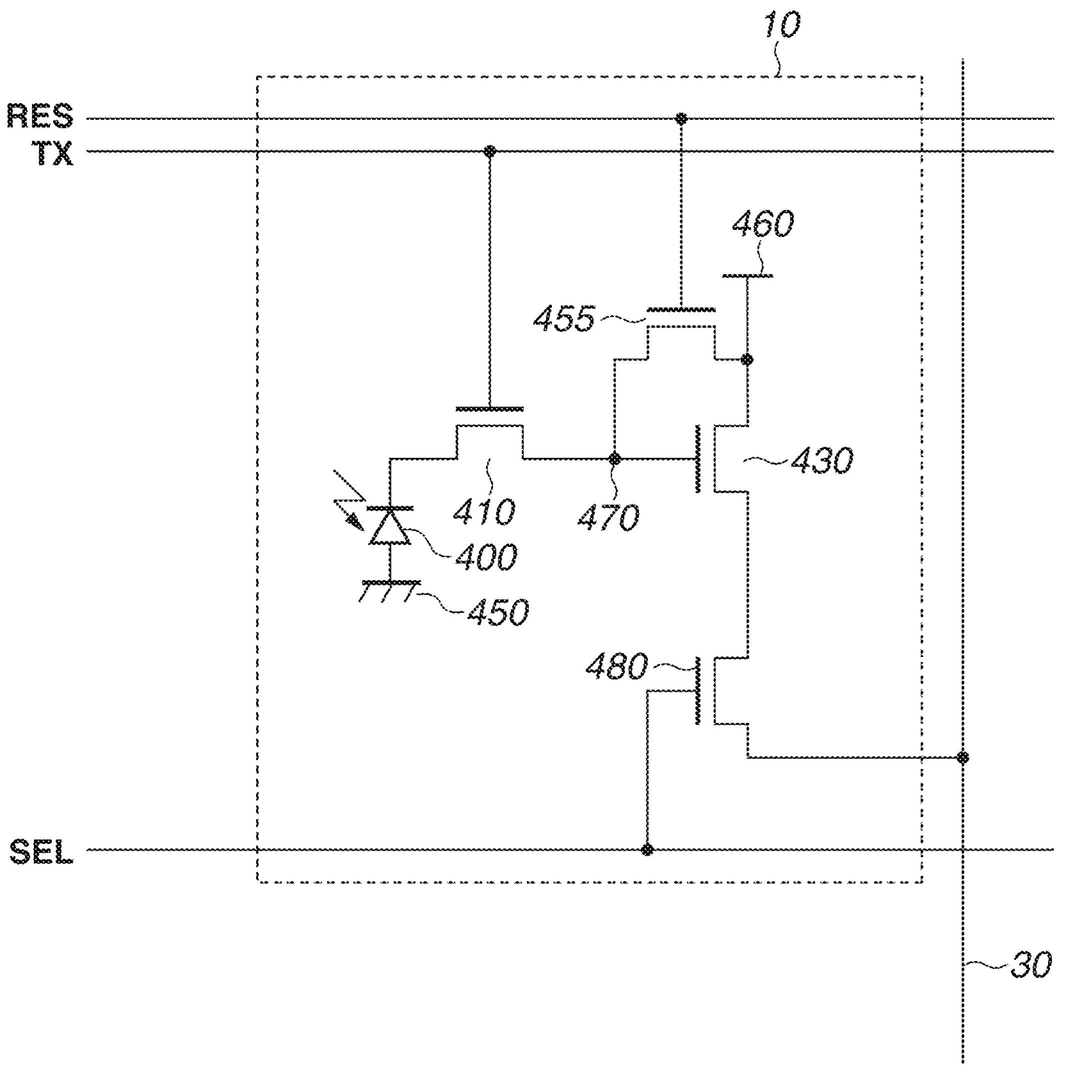
FIG. 2 is a schematic diagram of the photoelectric conversion device according to the first exemplary embodiment.
Figure 3:
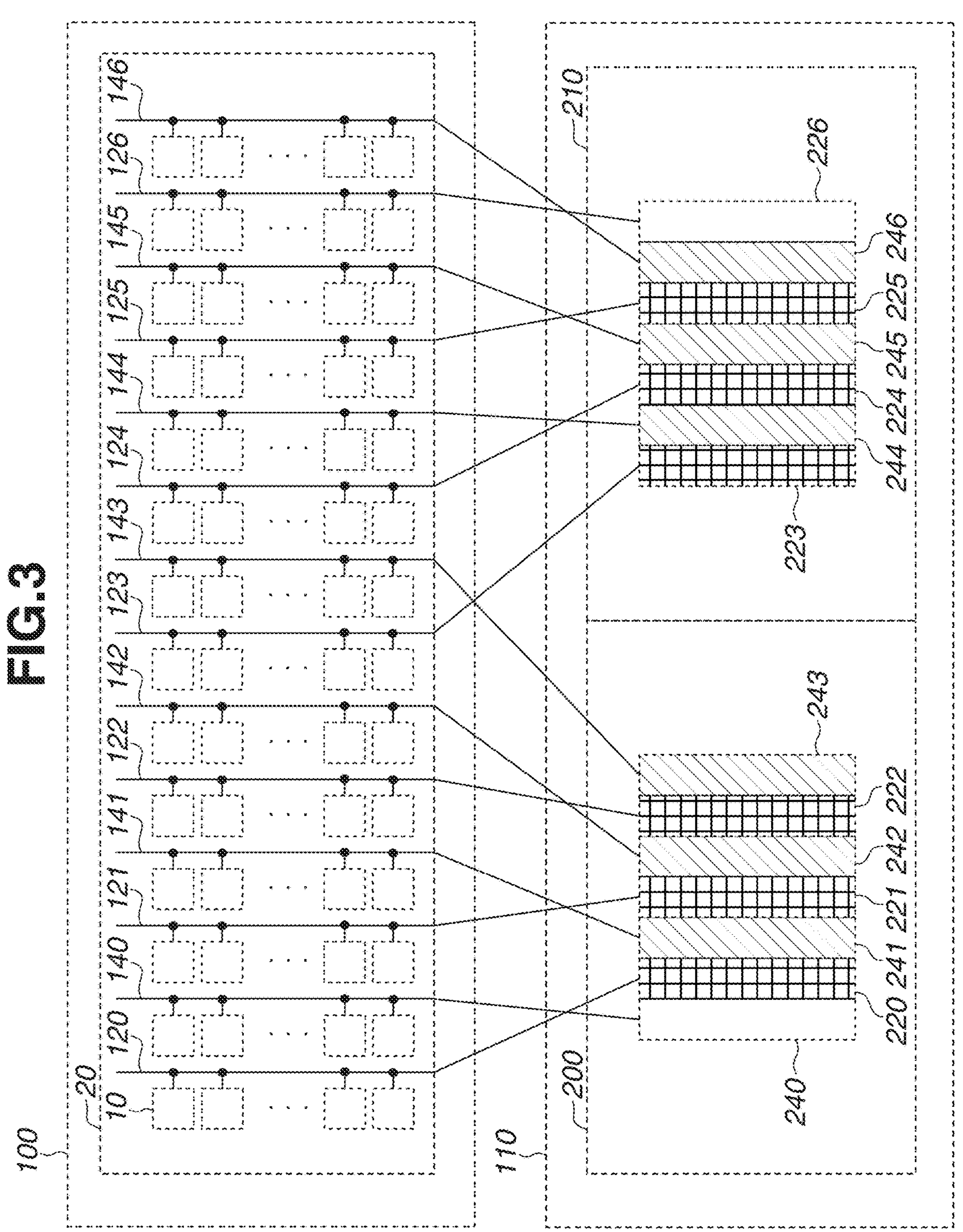
FIG. 3 is a schematic diagram of the photoelectric conversion device according to the first exemplary embodiment.

FIGS. 1, 2, and 3 are schematic diagrams of a photoelectric conversion device according to a first exemplary embodiment.

The photoelectric conversion device illustrated in FIG. 1 includes pixels 10, a pixel array 20, vertical lines 30, vertical lines 31, current sources 40, current sources 41, a ramp signal generation circuit 50, a ramp signal generation circuit 51, comparators 60, and comparators 61. The photoelectric conversion device further includes first memories 70, first memories 71, second memories 80, second memories 81, a counter 90, and a counter 91.

A plurality of pixels 10 is arranged on the pixel array 20 in a plurality of rows and a plurality of columns in an array state.

A vertical line extending in a column direction (vertical direction in FIG. 1) is arranged on each of the columns of the pixel array 20. The vertical line is connected to each of the pixels 10 arranged in the column direction, and forms a signal line common to these pixels 10.

The number of pixels 10 constituting the pixel array 20 is not limited in particular. For example, like a normal digital camera, the pixel array 20 may consist of several thousands of rows and several thousands of columns of pixels 10, or may consist of a plurality of pixels 10 arranged in one row.

Pixel signals read out from the pixels 10 are input to a signal processing circuit via the vertical line. The signal processing circuit includes comparators for comparing the pixel signals read out from the pixels 10 with reference signals output from a ramp signal generation circuit and memories for storing the signals. The pixel signals are sequentially output for each column via the signal processing circuit.

(Configuration of Pixel)

A configuration of a pixel 10 according to the present exemplary embodiment is described.

FIG. 2 is a diagram illustrating an example of an equivalent circuit of a pixel 10. Each pixel 10 includes a photodiode 400, a transfer transistor 410, a floating diffusion 470, a source follower transistor 430, a selection transistor 480, a GND node 450, a reset transistor 455, and a power source node 460.

The photodiode 400 is electrically grounded at the GND node 450. The photodiode 400 is connected to the transfer transistor 410. A control signal is input to a gate of the transfer transistor 410 from a control signal line TX. The transfer transistor 410 has a node common to the reset transistor 455 and a gate of the source follower transistor 430, and this common node serves as the floating diffusion 470. The reset transistor 455 and the source follower transistor 430 are connected to the power source node 460. A reset signal is input to the gate of the reset transistor 455 from a reset signal line RES. The source follower transistor 430 is connected to the selection transistor 480, and a selection signal is input to a gate of the selection transistor 480 from a selection signal line SEL. The selection transistor 480 is connected to the vertical line 30.

(Functions of Constituent Elements)

Functions of the constituent elements of the photoelectric conversion device according to the present exemplary embodiment are described.

The photodiode 400 photoelectrically converts light incident thereon and generates electric charges.

The electric charges photoelectrically converted by the photodiode 400 are transferred to the floating diffusion 470 via the transfer transistor 410, and converted into signal voltage through the parasitic capacitance accompanying with the floating diffusion 470. The signal voltage is input to the gate of the source follower transistor 430 and output to the vertical line 30 via the selection transistor 480. The source follower transistor 430 and the current source 40 illustrated in FIG. 1 constitute a source follower, and the signal voltage present in the floating diffusion 470 is output to the vertical line 30 via the source follower.

The comparator 60 compares the signal of the vertical line 30 with the ramp signal output from the ramp signal generation circuit 50. The first memory 70 takes in a count signal from the counter 90 at a timing the comparator 60 is changed. Through the above operation, an analog signal of the pixel 10 is converted into a digital signal through AD conversion. A digital signal retained in the first memory 70 is transferred to the second memory 80 and output to the outside of the chip. In the above-described present exemplary embodiment, the common counters 90 and 91 are used for the plurality of circuits. However, it is also common to arrange a counter for each circuit corresponding to each vertical line, while supplying a common count clock to each signal processing circuit. The present invention is also applicable to the above-described configuration.

(Element Arrangement of Photoelectric Conversion Device According to the Present Exemplary Embodiment)

FIG. 3 is a schematic diagram illustrating an example of element arrangement of the photoelectric conversion device according to the present exemplary embodiment.

FIG. 3 illustrates a photoelectric conversion device having a laminated structure including a pixel substrate 100 (first semiconductor substrate) and a circuit substrate 110 (second semiconductor substrate).

In this photoelectric conversion device, the pixel array 20 is arranged on the pixel substrate 100. Vertical lines 120 to 126 are signal lines (first signal lines) corresponding to odd columns of the pixel array 20, and vertical lines 140 to 146 are signal lines (second signal lines) corresponding to even columns of the pixel array 20. Hereinafter, the vertical lines 120 to 126 and the vertical lines 140 to 146 are called a vertical line group 1 and a vertical line group 2, respectively.

The circuit substrate 110 includes two signal processing circuits 200 and 210, and reads out the signals of the pixels 10 included in the pixel array 20 through the signal processing circuits 200 and 210. The signal processing circuits 200 and 210 have unit circuits 220 to 226 for reading out the signals of the vertical line group 1 and unit circuits 240 to 246 for reading out the signals of the vertical line group 2. Hereinafter, the unit circuits 220 to 226 are called a signal processing circuit 1 (first signal processing circuit), and the unit circuits 240 to 246 are called a signal processing circuit 2 (second signal processing circuit).

For example, the signal processing circuit 1 includes the current sources 40, the first comparators 60, the first memories 70, and the second memories 80 illustrated in FIG. 1. The signal processing circuit 2 includes the current sources 41, the second comparators 61, the first memories 71, and the second memories 81 illustrated in FIG. 1.

In the comparison example illustrated in FIG. 3, the order of the vertical lines arranged on the pixel substrate 100 is different from the order of the corresponding unit circuits arranged on the circuit substrate 110.

(Comparison Example of Element Arrangement)

Figure 4:
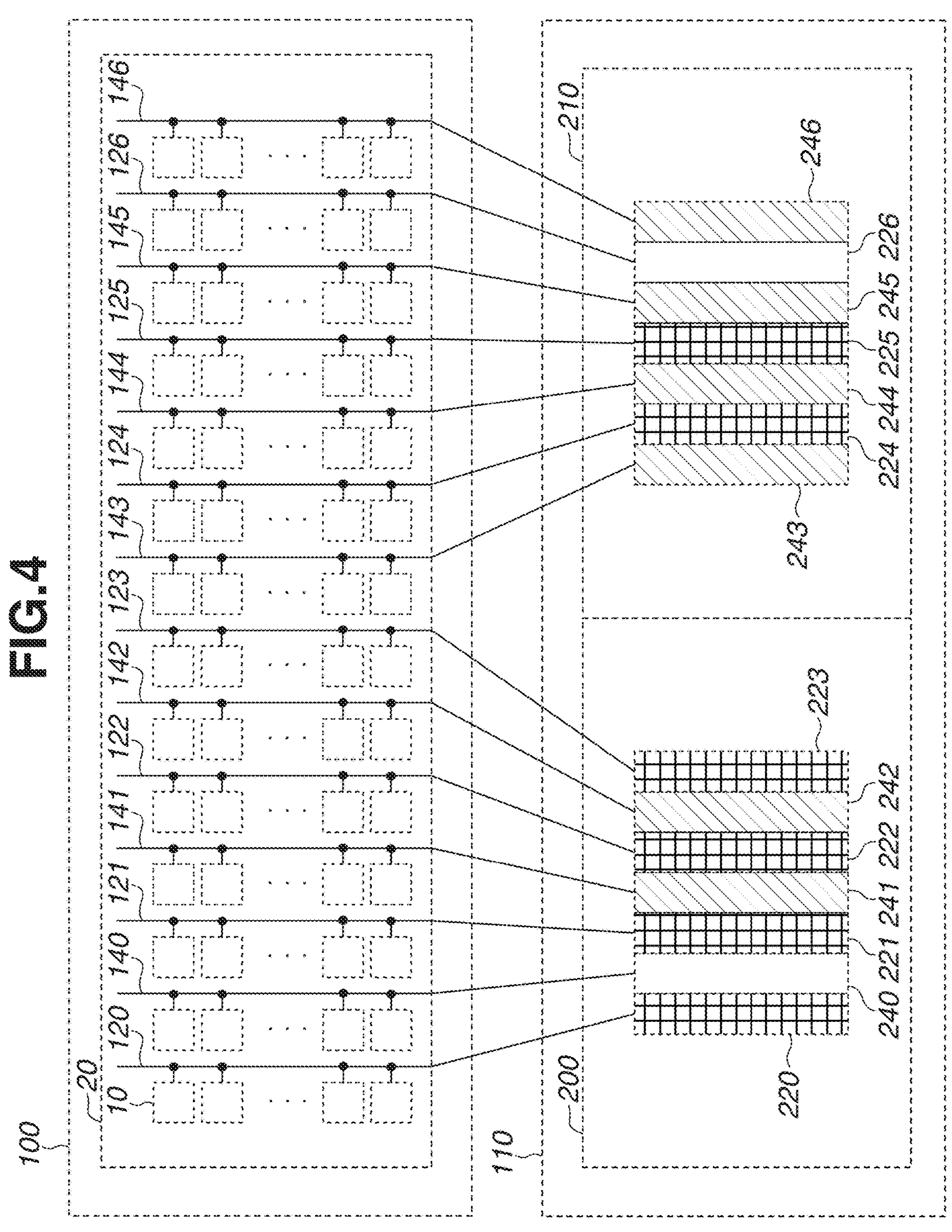
FIG. 4 is a schematic diagram of the photoelectric conversion device according to the first exemplary embodiment.

FIG. 4 illustrates a comparison example of the element arrangement of the photoelectric conversion device.

FIG. 3 and FIG. 4 are different in terms of wire connections between the vertical line groups 1 and 2 (vertical lines 120 to 126 and vertical lines 140 to 146) and the signal processing circuits 1 and 2 (unit circuits 220 to 226 and unit circuits 240 to 246).

In the comparison example illustrated in FIG. 4, the order of the vertical lines arranged on the pixel substrate 100 conforms to the order of the corresponding unit circuits arranged on the circuit substrate 110.

In a general photoelectric conversion device, pixel signals read from the vertical line group 1 and pixel signals read from the vertical line group 2 correspond to different colors. For example, while signals of red pixels are read from the vertical line group 1, signals of green pixels are read from the vertical line group 2. A color filter corresponding to a wavelength band of visible light of one specific color, i.e., red, green, or blue, is arranged for each pixel, so that the pixel is associated with color. For example, a first color filter corresponding to a first color is arranged on a first pixel, and a second color filter corresponding to a second color different from the first color is arranged on a second pixel. Further, in a case where signals of pixels arranged next to each other in a horizontal direction are to be added up, addition-target pixels of red and green may be shifted in the horizontal direction.

For example, addition of signals based on electric charges generated in three rows of pixels arranged next to each other in the horizontal direction in FIG. 4 is considered. It is assumed that signals of the unit circuits 220 to 222 serving as the signal processing circuit 1 for reading signals from the vertical lines 120 to 122 of the vertical line group 1 are regarded as the addition targets. In this case, signals of the unit circuits 241 to 243 serving as the signal processing circuit 2 for reading signals from the vertical lines 141 to 143 of the vertical line group 2 are regarded as the addition targets. At this time, signals of the vertical line 140 of the vertical line group 2 is not regarded as the addition targets.

The following issue arises in a case where the vertical line group 1 (vertical lines 120 to 126) and the vertical line group 2 (vertical lines 140 to 146) are sequentially connected to the signal processing circuit 1 (unit circuits 220 to 226) and the signal processing circuit 2 (unit circuits 240 to 246) as illustrated in FIG. 4.

In FIG. 4, the unit circuits 241 to 243 of the signal processing circuit 2 for processing the signals of the vertical lines 141 to 143 of the vertical line group 2 as the addition targets are separately arranged on the two signal processing circuits 200 and 210. The same can also be said for the unit circuits 223 to 225 of the signal processing circuit 1 for processing the signals of the vertical lines 123 to 125 of the vertical line group 1. In this case, when digital signals of unit circuits are to be added up, signal processing becomes complicated because the signals have to be exchanged between the two signal processing circuits 200 and 210. Further, for example, in a case where wiring which connects the unit circuits 241 to 243 of the signal processing circuit 2 is arranged in a lateral direction in order to execute addition of the analog signals before AD conversion, a length of the wiring becomes long. Therefore the processing speed is lowered because of the parasitic capacitance.

In FIG. 3, the wire connections between the vertical line group 1 (vertical lines 120 to 126) and the signal processing circuit 1 (unit circuits 220 to 226) intersect with the wire connections between the vertical line group 2 (vertical lines 140 to 146) and the signal processing circuit 2 (unit circuits 240 to 246). In other words, in a planar view the pixel array is viewed from an upper face thereof, for example, the unit circuit included in the signal processing circuit 1 is located on a left side of the unit circuit included in the signal processing circuit 2 if the vertical line included in the vertical line group 1 is located on a right side of the vertical line included in the vertical line group 2. With this configuration, the unit circuits 241 to 243 of the signal processing circuit 2 for processing the signals of the vertical lines 141 to 143 of the vertical line group 2 as the addition targets are not separately arranged on the two signal processing circuits 200 and 210. Further, the same can also be said for the unit circuits 223 to 225 of the signal processing circuit 1 for processing the signals of the vertical lines 123 to 125 of the vertical line group 1 regarded as addition targets when addition of pixel signals of three rows in the horizontal direction is executed.

In other words, the photoelectric conversion device according to the present exemplary embodiment includes a pixel array on which a plurality of pixels including a first pixel, a second pixel, and a third pixel is arranged. The first pixel and the second pixel are arranged to be parallel to a first direction (i.e., a direction parallel to a row) in a planar view the pixel array is viewed from an upper face thereof, and the first pixel is located at a position separated from a position of the second pixel in a positive direction of the first direction. The first pixel and the third pixel are arranged to be parallel to a second direction (i.e., a direction parallel to a column), and the first pixel and the third pixel are connected to a first signal line whereas the second pixel is connected to a second signal line. The first signal line is connected to a first signal processing circuit, the second signal line is connected to a second signal processing circuit, and the first signal processing circuit and the second signal processing circuit are arranged to be parallel to the first direction. The first signal processing circuit is located at a position separated from a position of the second signal processing circuit in a direction having a component of a negative direction of the first direction.

Further, in other words, the photoelectric conversion device according to the present exemplary embodiment includes a pixel array on which a plurality of pixels including a first pixel and a second pixel is arranged. The first pixel is connected to a first signal processing circuit via a first signal line, the second pixel is connected to a second signal processing circuit via a second signal line, and in a planar view the pixel array is viewed from an upper face thereof, the photoelectric conversion device has a portion at which a third signal line extending from the first signal line to the first signal processing circuit intersects with the second signal line and a portion at which a fourth signal line extending from the second signal line to the second signal processing circuit intersects with the first signal line.

Through the above-described configuration, it is possible to suppress lowering of reading speed or complicatedness of signal processing, when the solid-state imaging device which reads out pixel signals by using two signal processing circuits executes the analog or digital horizontal addition.

Further, in FIGS. 3 and 4, the wire connections are illustrated schematically in order to clearly illustrate a difference in the wire connections between the vertical lines and the unit circuits. Further, a publicly-known technique such as a technique using a through-silicon via (TSV) electrode penetrating through substrates or a technique using hybrid bonding is employed for a bonded portion for connecting the signals between the substrates, although it is not illustrated in FIGS. 3 and 4. For example, in a case where the latter technique is employed, a bonded portion of an insulating body of the pixel substrate 100 and an insulating body of the circuit substrate 110 and a bonded portion of a metal of the pixel substrate 100 and a metal of the circuit substrate 110 are formed on a bonded face.

In the present exemplary embodiment, a photoelectric conversion device having a laminated structure is described as an example. However, the structure of the photoelectric conversion device is not limited thereto. The present invention is also applicable to a photoelectric conversion device having a single substrate.

Although the photoelectric conversion device illustrated in FIG. 3 does not have any signal processing circuit in a vicinity of the bonded portion of the signal processing circuits 200 and 210, a vertical scanning circuit for driving the respective signal processing circuits arranged on the signal processing circuits 200 and 210 may be arranged.

Although analog addition of pixel signals is described as an example, the arithmetic processing executed by the photoelectric conversion device according to the present exemplary embodiment is not limited to addition processing. The present invention is also applicable to the arithmetic processing executed on the pixel signals read from the vertical lines, such as edge detection and AF signal calculation conducted through subtraction processing and correction processing using adjacent pixels. The same can also be said for the following exemplary embodiments.

Second Exemplary Embodiment

Figure 5:
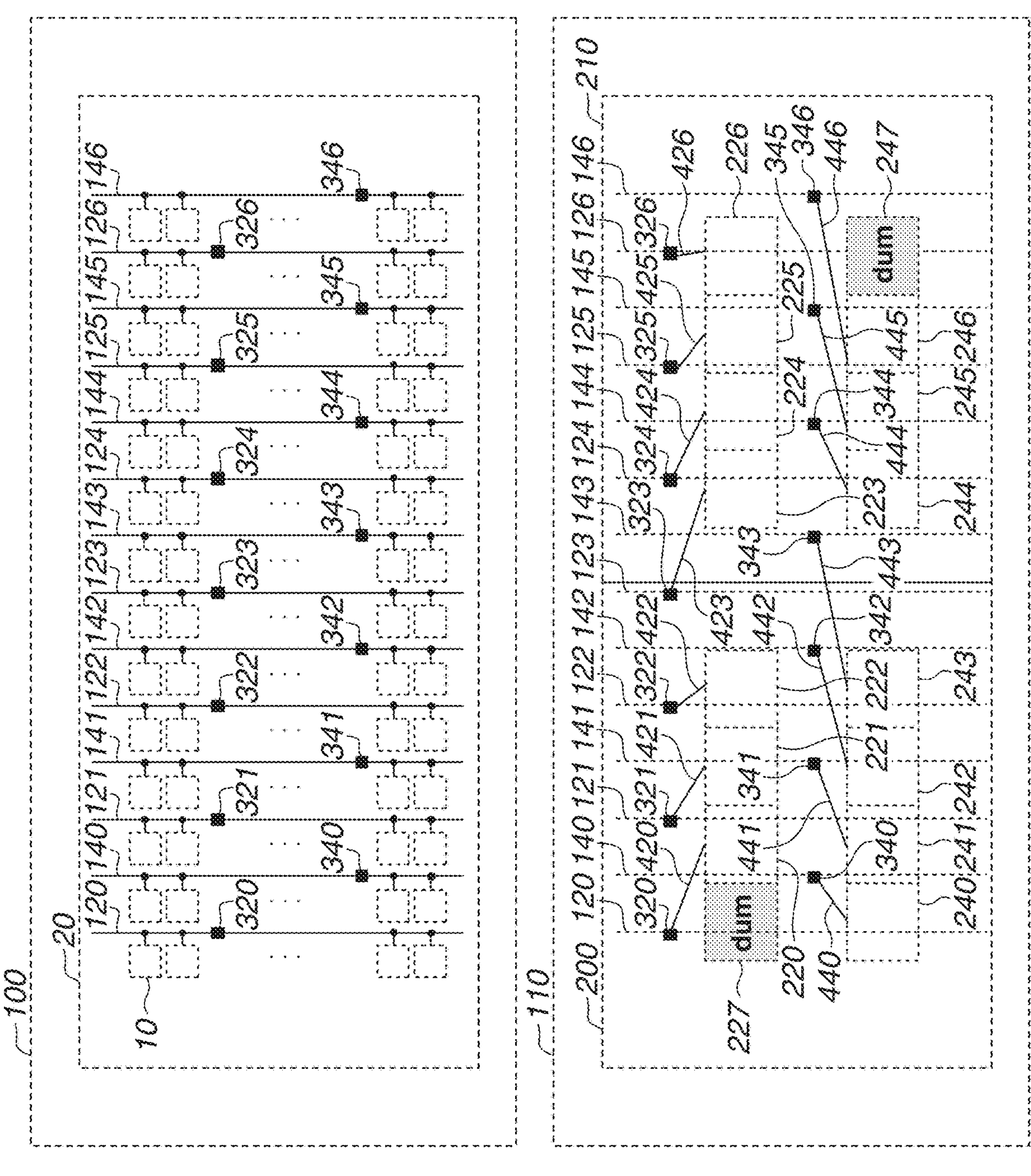
FIG. 5 is a schematic diagram of a photoelectric conversion device according to a second exemplary embodiment.

FIG. 5 is a schematic diagram of the photoelectric conversion device according to a second exemplary embodiment. Hereinafter, descriptions common to those of the first exemplary embodiment are omitted, and only the points different from FIG. 3 are described.

The photoelectric conversion device in FIG. 5 is different from the photoelectric conversion device in FIG. 3 in that the signal processing circuits 1 and 2 are not mixed and arranged next to each other. The signal processing circuits 1 and 2 are arranged to be separated from each other. In this way, parasitic capacitance generated between the vertical lines 120 to 126 of the vertical line group 1 and the vertical lines 140 to 146 of the vertical line group 2 can be reduced, and color mixture can be suppressed.

In FIG. 5, bonded portions 320 to 326 are board-to-board bonded portions between the vertical lines 120 to 126 of the vertical line group 1 and the unit circuits 220 to 226 of the signal processing circuits 1. Bonded portions 340 to 346 are board-to-board bonded portions between the vertical lines 140 to 146 of the vertical line group 2 and the unit circuits 240 to 246 of the signal processing circuits 2. The wire connections 420 to 426 between the vertical line group 1 (vertical lines 120 to 126) and the signal processing circuit 1 (unit circuits 220 to 226) and the wire connections 440 to 446 between the vertical line group 2 (vertical lines 140 to 146) and the signal processing circuit 2 (unit circuits 240 to 246) have directional components heading toward the opposite directions, i.e., right and left. In other words, when a direction of the wire connection is resolved into an x component and a y component, one wire connection heads toward the positive direction of the x component, whereas another wire connection heads toward the negative direction. In other words, the positions on the substrate, where the bonded portions 320 to 326 of the vertical line group 1 and the signal processing circuits 1 are arranged, and the positions on the substrate, where the bonded portions 340 to 346 of the vertical line group 2 and the signal processing circuits 2 are arranged, are separated from each other in the wiring direction of the vertical line. It can also be said that the bonded portions 340 to 346 are arranged to be separated from the bonded portions 320 to 326 in a direction orthogonal to a direction the bonded portions 320 to 326 are arranged. Therefore, in a planar view the pixel substrate is viewed from an upper face thereof, the photoelectric conversion device includes the portions at which the wire connections 420 to 426 as the third signal lines connected to the vertical line group 1 as the first signal lines arranged on the pixel substrate intersect with the vertical line group 2 as the second signal lines.

Through the arrangement having the above-described intersection portions, the unit circuits 241 to 243, which process the signals of the vertical lines 141 to 143 as the addition targets, are prevented from being separately arranged on the two signal processing circuits 200 and 210 when addition of signals of pixels arranged in three rows in the horizontal direction are executed. The same can also be said for the unit circuits 223 to 225 which process the signals of the vertical lines 123 to 125 as the addition targets.

As described above, when the positions on the substrate, where the bonded portions 320 to 326 are arranged, and the positions on the substrate, where the bonded portions 340 to 346 are arranged, are separated from each other in the wiring direction of the vertical line, the signal processing circuits 1 and 2 are also separately arranged on the substrate. Therefore, it is possible to suppress color mixture.

In order to realize the above-described arrangement of the bonded portions, positions of the bonded portions are shifted by arranging dummy circuits 227 and 247 as necessary.

Therefore, according to the present exemplary embodiment, it is possible to suppress lowering of reading speed or complicatedness of signal processing, when the solid-state imaging device which reads out pixel signals by using two signal processing circuits executes the analog or digital horizontal addition.

Further, in the present exemplary embodiment, the wire connections 420 to 426 between the vertical lines 120 to 126 and the unit circuits 220 to 226 and the wire connections 440 to 446 between the vertical lines 140 to 146 and the unit circuits 240 to 246 are prevented from intersecting with each other. In this way, it is possible to suppress occurrence of cross talk, caused by potential fluctuation of the vertical lines 120 to 126 propagating to the vertical lines 140 to 146 via the parasitic capacitance.

Further, because the unit circuits 220 to 226 of the signal processing circuit 1 and the unit circuits 240 to 246 of the signal processing circuit 2 are arranged to be separated from each other, the comparators 60 included in the unit circuits 220 to 226 and the comparators 61 included in the unit circuits 240 to 246 are also arranged to be separated from each other. With this arrangement, it is possible to suppress occurrence of color mixture caused by interference when output of the comparators 60 is changed.

Third Exemplary Embodiment

Figure 6:
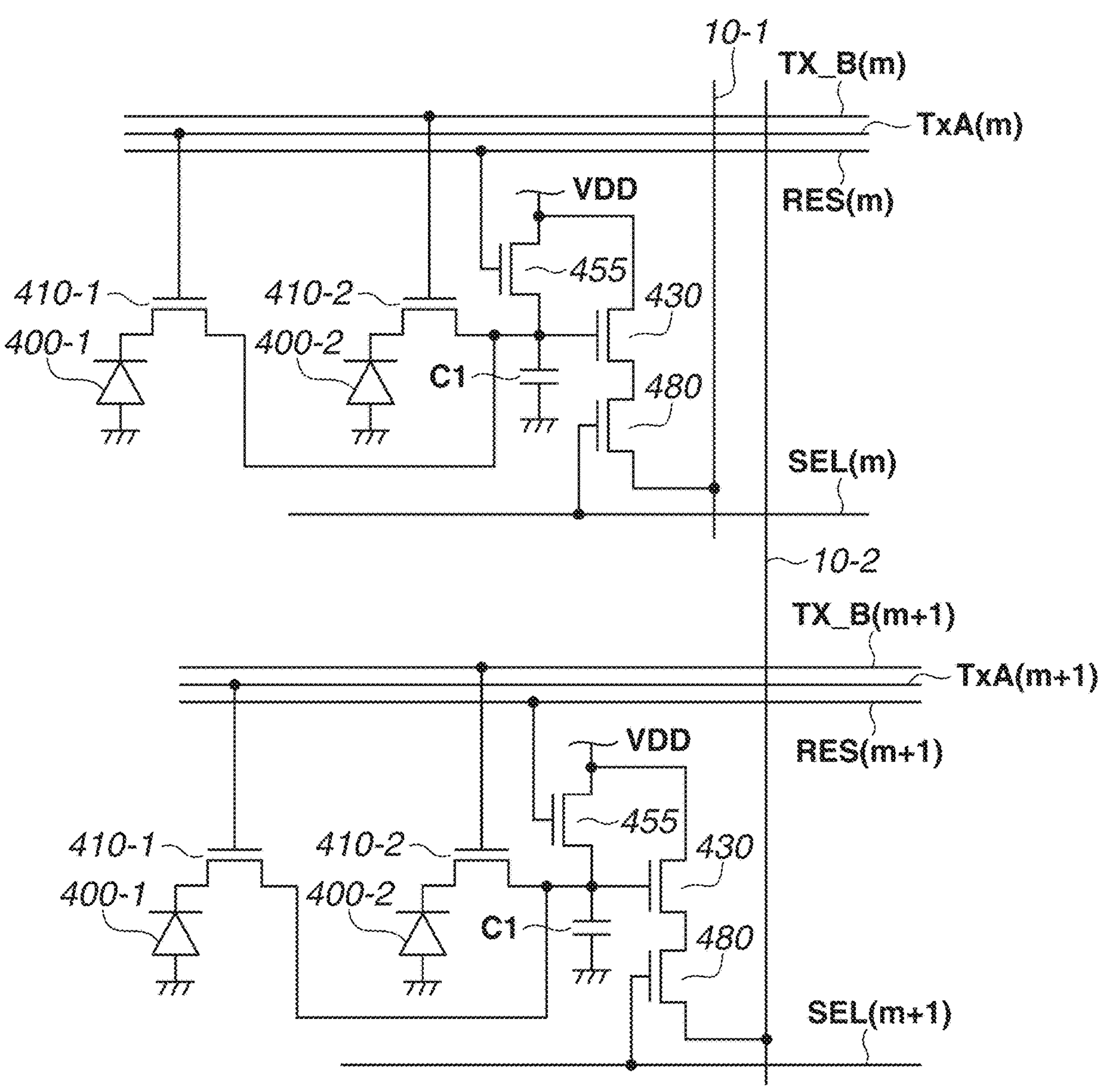
FIG. 6 is an equivalent circuit diagram of pixels included in a photoelectric conversion device according to a third exemplary embodiment.
Figures 7A, 7B, 7C:
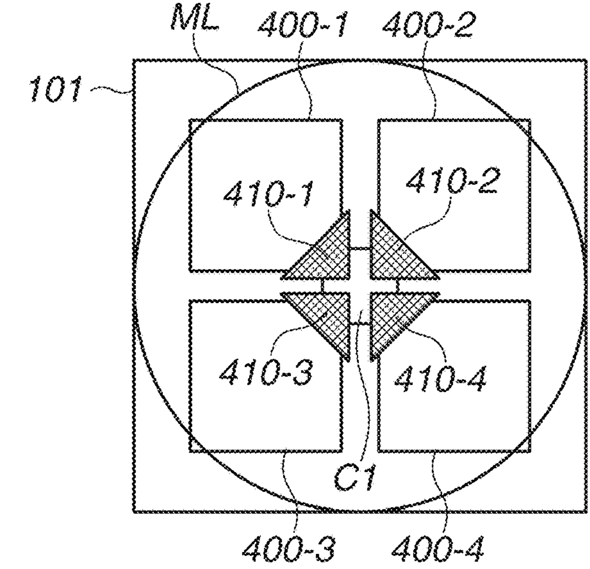
FIG. 7A is a schematic cross-sectional diagram of the photoelectric conversion device according to the third exemplary embodiment.
FIG. 7B is a schematic cross-sectional diagram of the photoelectric conversion device according to the third exemplary embodiment.
FIG. 7C is a schematic cross-sectional diagram of the photoelectric conversion device according to the third exemplary embodiment.
Figure 8:
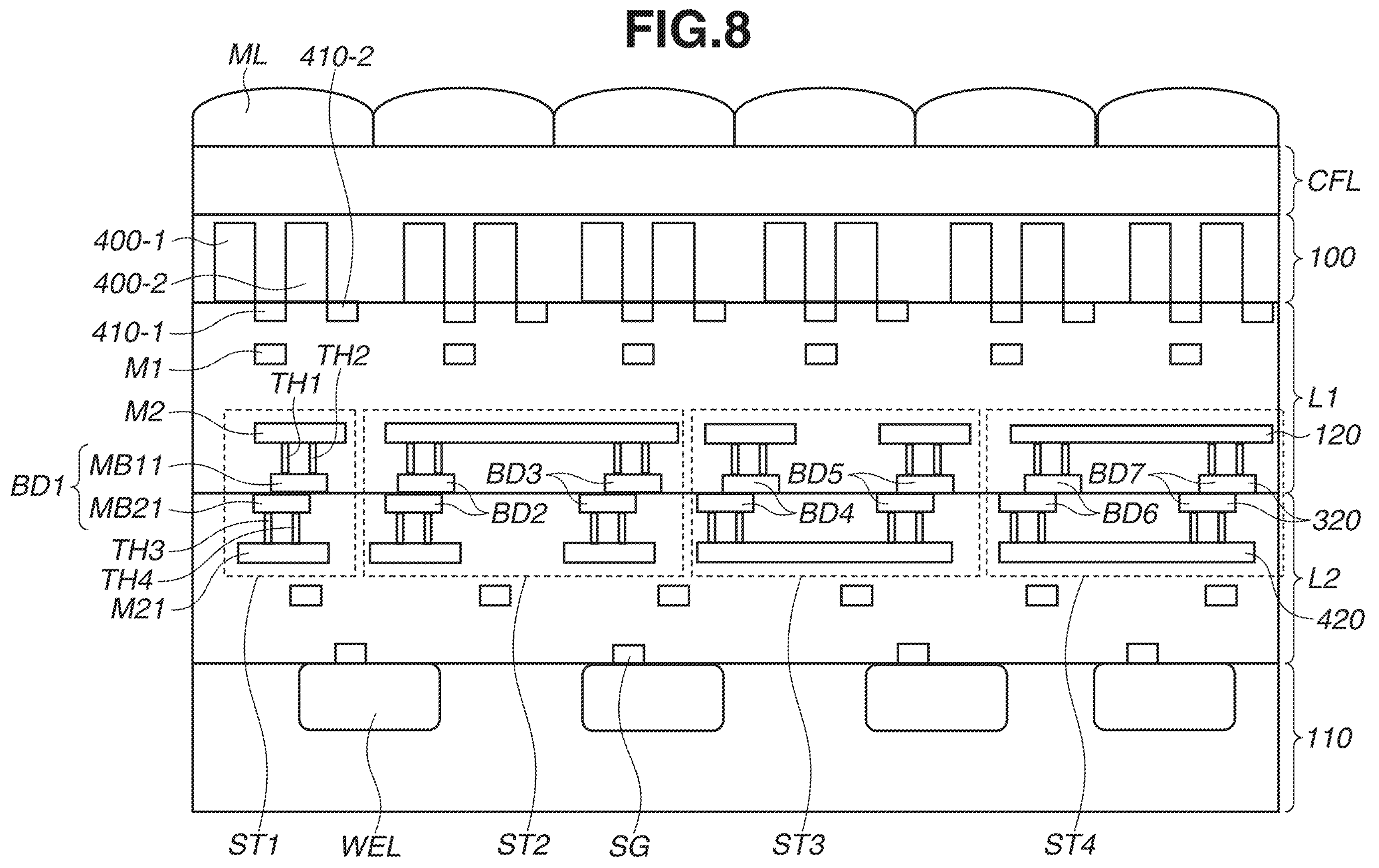
FIG. 8 is a schematic diagram of pixels included in the photoelectric conversion device according to the third exemplary embodiment.

FIGS. 6 to 8 are schematic diagrams of the photoelectric conversion device according to a third exemplary embodiment. Hereinafter, descriptions common to those of the first and second exemplary embodiments are omitted. The present exemplary embodiment is different from the first and second exemplary embodiments in that each pixel 10 has a plurality of photoelectric conversion portions and can execute focus detection using a phase-difference detection method. The present exemplary embodiment is practically the same as the other exemplary embodiments except for the above points and the points described below, so that the same descriptions are omitted.

FIG. 6 is a circuit diagram illustrating an example of a circuit of pixels 10 in two rows and one column, from among the pixels 10 arranged on the pixel array 20.

Each pixel 10 includes photodiodes 400-1 and 400-2 serving as photoelectric conversion portions, transfer transistors 410-1 and 410-2, an electric charge conversion portion C1, a reset transistor 455, an amplification transistor 430, and a selection transistor 480. The transfer transistor 410-1 is arranged on an electric pathway between a node in which the electric charge conversion portion C1, the reset transistor 455, and the amplification transistor 430 are connected and the photodiode 400-1. The transfer transistor 410-2 is arranged on an electric pathway between a node in which the electric charge conversion portion C1, the reset transistor 455, and the amplification transistor 430 are connected and the photodiode 400-2. The electric charge conversion portion C1 is also called a floating diffusion (FD) portion. A power-supply voltage VDD is applied to the reset transistor 455 and the amplification transistor 430. The selection transistor 480 is arranged on an electric pathway between the amplification transistor 430 and a vertical output line 30. It can be said that the amplification transistor 430 is electrically connected to the vertical output line 30 via the selection transistor 480. The electric charge conversion portion C1 includes the floating diffusion capacitance provided on the semiconductor substrate and the parasitic capacitance of the electric pathway from the selection transistor 480 to the amplification transistor 430 via the floating diffusion capacitance. A signal RES, a signal Tx_A, and a signal SEL are signals supplied from a vertical scanning circuit (not illustrated).

As illustrated in FIG. 7A, the photodiodes 400-1 and 400-2 are arranged to correspond to one microlens ML. In other words, the photodiodes 400-1 and 400-2 are arranged to receive light passing through the one microlens ML. With this configuration, the photoelectric conversion device can execute focus detection employing a phase-difference detection method.

In addition, another photodiode may be arranged between the photodiodes 400-1 and 400-2 in FIG. 7A. This is an example of the configuration in which three or more photodiodes are arranged to correspond to one microlens. By individually reading the signal of the photodiode arranged between the photodiodes 400-1 and 400-2, it is possible to further improve the functions thereof. For example, it is possible to acquire an image with improved gradation with respect to signals of high luminance while lowering the sensitivity, by arranging the photodiode having the area smaller than the areas of the photodiodes 400-1 and 400-2. Further, the signal of the photodiode arranged between the photodiodes 400-1 and 400-2 can be read at a timing different from a timing the signal is read from the photodiodes 400-1 and 400-2. In this way, it is possible to generate an image with improved temporal resolution.

In addition, the configuration of the pixel according to the present exemplary embodiment is not limited to the configuration illustrated in FIGS. 6 and 7A. The pixel may have three or more photoelectric conversion portions with respect to one microlens ML. FIGS. 7B and 7C illustrate examples of three or more photoelectric conversion portions arranged with respect to one microlens ML. In each of the examples, four photodiodes 400-1 to 400-4 are arranged as four photoelectric conversion portions. Respective transfer transistors are arranged to correspond to the photodiodes 400-1 to 400-4, and gates 410-1 to 410-4 are gate electrodes of the corresponding transfer transistors. In FIG. 7B, the gates 410-1 and 410-3 transfer electric charges to a pixel read-out circuit R1. The gates 410-2 and 410-4 transfer electric charges to a pixel read-out circuit R2. The electric charge conversion portion C1 illustrated in FIG. 6 is arranged on each of the pixel read-out circuits R1 and R2. The reset transistor 455, the amplification transistor 430, and the selection transistor 480 illustrated in FIG. 6 may be arranged on each of the pixel read-out circuits R1 and R2, or may be arranged on either one of the pixel read-out circuits R1 and R2.

In FIG. 7C, the gates 410-1 to 410-4 are arranged to transfer electric charges to one electric charge conversion portion C1. The present exemplary embodiment can preferably be implemented on the above-described embodiment.

Further, in the above-described exemplary embodiment, light is incident on both of the photodiodes 400-1 and 400-2 arranged to correspond to one microlens ML. As another example, one of the photodiodes 400-1 and 400-2 may be shielded from light, so that light is incident on another one. In this case, part of the pixels 10 are brought into a state where light is incident on either one of the photodiodes 400-1 and 400-2, whereas another part of the pixels 10 are brought into a state where light is incident on the other of the photodiodes 400-1 and 400-2. Through the above-described configuration, focus detection employing the phase-difference detection method can also be executed by reading the signals of part of the pixels 10 and the signals of another part of the pixels 10. For example, the read signals are used for focus detection executed by a detection portion arranged on the circuit substrate.

Although all of the pixels 10 arranged on the pixel array may have the configuration illustrated in FIG. 6, the present exemplary embodiment is not limited thereto. At least part of the pixels 10 may have the configuration illustrated in FIG. 6, and another part of the pixels 10 may have the configuration illustrated in FIG. 2. In this case, focus detection can also be executed by using the signals of the pixels 10 having the configuration illustrated in FIG. 6.

An example of a bonding structure of the pixel substrate 100 and the circuit substrate 110 of the present exemplary embodiment is illustrated in FIG. 8.

A first structure layer CFL is arranged between the microlenses ML and the pixel substrate 100. An antireflection film and a color filter are arranged on the first structure layer CFL. Further, the first structure layer CFL may also include a fixed charge film arranged on a first face (light incident face) of the pixel substrate 100.

The photodiodes 400-1 and 400-2 are arranged on the pixel substrate 100. The gates 410-1 and 410-2 of the transfer transistors are arranged on a second face of the pixel substrate 100. Gates (not illustrated) of the other transistors are also arranged on the second face of the pixel substrate 100.

A second structure layer L1 and a third structure layer L2 are arranged between the pixel substrate 100 and the circuit substrate 110. The second structure layer L1 has a plurality of wiring layers and a plurality of interlayer insulation films. Wiring layers M1 and M2 are illustrated as the plurality of wiring layers. The second structure layer L1 further includes a first conductive portion MB11. The first conductive portion MB11 is connected to the wiring layer M2 through a plurality of interlayer connection portions TH1 and TH2.

The third structure layer L2 also includes a plurality of wiring layers and a plurality of interlayer insulation films. A wiring layer M21 is illustrated as one of the plurality of wiring layers. The third structure layer L2 further includes a second conductive portion MB 21. The first conductive portion MB11 and the second conductive portion MB21 are electrically connected by making contact with each other. A bonded portion BD1 is formed by the first conductive portion MB11 and the second conductive portion MB21. Further, a first insulation film is formed on a face the first conductive portion MB11 is arranged. Furthermore, a second insulation film is formed on a face the second conductive portion MB21 is arranged. The insulation film arranged on the face the first conductive portion MB11 is arranged and the insulation film arranged on the face the second conductive portion MB21 is arranged are bonded to each other. In other words, at a bonded face of the second structure layer L1 and the third structure layer L2, the first conductive portion MB11 and the second conductive portion MB21 are bonded to each other, and the insulation film included in the second structure layer L1 and the insulation film included in the third structure layer L2 are bonded to each other. The insulation film included in the second structure layer L1 and the insulation film included in the third structure layer L2 are films which contain silicon and oxygen. The second conductive portion MB21 is connected to the wiring layer M21 through a plurality of interlayer connection portions TH3 and TH4. The interlayer connection portions TH1, TH2, TH3, and TH4 are made of conductive materials such as tungsten. The wiring layers M1, M2, and M21 are also made of conductive materials such as copper and aluminum. The first conductive portion MB11 and the second conductive portion MB21 which form the bonded portion BD1 are also made of conductive materials such as copper.

A well region WEL is arranged in the circuit substrate 110. A gate SG of each transistor is arranged between the circuit substrate 110 and the wiring layer.

Structures ST1 to ST4 of several bonded portions are illustrated in FIG. 8. In the structure ST1 which includes the above-described bonded portion BD1, one electrical node is formed of one first conductive portion and one second conductive portion. In each of the structures ST2 to ST4, one electrical node is formed of a plurality of bonded portions.

In the structure ST2, one wiring layer included in the second structure layer L1 is connected to a plurality of bonded portions BD2 and BD3. On the other hand, one of the wiring layers included in the third structure layer L2 is connected to the bonded portion BD2, and another one of the wiring layers is connected to the bonded portion BD3.

In the structure ST3, one of the wiring layers included in the second structure layer L1 is connected to the bonded portion BD4, and another one of the wiring layers is connected to the bonded portion BD5. On the other hand, one wiring layer included in the third structure layer L2 is connected to the bonded portions BD4 and BD5.

In the structure ST4, one wiring layer included in the second structure layer L1 is connected to the bonded portions BD6 and BD7. On the other hand, one wiring layer included in the third structure layer L2 is connected to the bonded portions BD6 and BD7.

The above-described structures ST1 to ST4 can be used as appropriate depending on a location of the photoelectric conversion device and a signal (voltage) to be transmitted.

For example, in a case where a pathway is provided as a transmission pathway of power-supply voltage, any one of the structures ST2 to ST4 is selected in order to reduce the resistance value of the transmission pathway. On the other hand, in a case where a pathway is provided as a transmission pathway for transmitting signals for columns or rows of unit pixels 101, the structure ST1 is selected because there is a restriction on a row pitch or a column pitch.

It is possible to provide redundancy to the bonded portions by using the structures ST2 to ST4 for the bonded portions. Even in a case where bonding failure caused by warpage of the substrate occurs in the first bonded portion of a plurality of bonded portions included in any one of the structures ST2 to ST4, electric conductivity can be maintained by the second bonded portion.

Further, the bonded portions BD1 to BD7 and the wiring connected thereto also function as the pathways for dissipating heat. Therefore, it is possible to preferably release heat by arranging long wiring at a portion having a large amount of heat generation. A plurality of interlayer connection portions TH1 to TH4 is connected to each of the first conductive portion MB11 and the second conductive portion MB21. With this configuration, heat can be released more easily and effectively in comparison to the case where one interlayer connection portion is arranged for each of the first conductive portion MB11 and the second conductive portion MB21.

In the configurations illustrated in FIGS. 7A to 7C, a plurality of photodiodes 400-1 and 400-2 is arranged with respect to one microlens. However, one photodiode 400 illustrated in FIG. 2 may be arranged with respect to one microlens. A signal used for focus detection employing the phase-difference detection method can be generated by partially shielding the one photodiode 400 from light. In this case, part of the pixels 10 are brought into a state where light is incident on only part of the area of the photodiode 400, whereas another part of the pixels 10 are brought into a state where light is incident on another part of the area of the photodiode 400. In other words, light-shielding films are arranged at different positions of photodiodes 400 in order to make the light incident positions of the photodiodes 400 of part of the pixels 10 different from the light incident positions of the photodiodes 400 of another part of the pixels 10. Through the above-described configuration, focus detection employing the phase-difference detection method can also be executed by reading the signals of part of the pixels 10 and the signals of another part of the pixels 10. With regard to the above-described configuration, a light-shielding film for partially shielding a photodiode 400 from light does not have to be arranged on a pixel 10 used for image capturing and not used for focus detection. In other words, a pixel 10 which outputs a signal used for focus detection includes a photodiode having an area shielded by a light-shielding film larger than a light-shielded area of a photodiode of a pixel 10 used for image capturing. A signal read from the pixel 10 used for focus detection is used for focus detection executed by a detection portion arranged on the circuit substrate. Matters described in the present exemplary embodiment, including the configurations illustrated in FIG. 6 and FIGS. 7A to 7C, can be implemented in combination with the other exemplary embodiments.

Further, the arithmetic processing executed by the photoelectric conversion device according to the present exemplary embodiment may be intended for only pixel signals output from the pixels other than the pixels used for focus detection.

Fourth Exemplary Embodiment

A photoelectric conversion system according to a present exemplary embodiment is described with reference to FIG. 9. FIG. 9 is a block diagram illustrating a schematic configuration of the photoelectric conversion system according to the present exemplary embodiment.

The photoelectric conversion device described in the first or second exemplary embodiment can be applied to various photoelectric conversion systems. A digital still camera, a digital camcorder, a monitoring camera, a copying machine, a facsimile device, a mobile phone, an in-vehicle camera, and an observation satellite can be given as the examples of the photoelectric conversion systems to which the above-described photoelectric conversion device can be applied. Further, a camera module which includes an optical system such as a lens and an image capturing device is also included in the photoelectric conversion systems.

FIG. 9 is a block diagram of a digital still camera as one example of the above-described photoelectric conversion systems.

The photoelectric conversion system illustrated in FIG. 9 includes an image capturing device 1004 as one example of the photoelectric conversion device and a lens 1002 which forms an optical image of an object on the image capturing device 1004. The photoelectric conversion system further includes a diaphragm 1003 capable of changing the amount of light passing through the lens 1002 and a barrier 1001 which protects the lens 1002. The lens 1002 and the diaphragm 1003 serve as an optical system which condenses light to the image capturing device 1004. The image capturing device 1004 is a photoelectric conversion device according to any one of the above-described exemplary embodiments, and converts an optical image formed by the lens 1002 into an electric signal.

The photoelectric conversion system further includes a signal processing unit 1007 serving as an image generation unit for generating an image by processing a signal output from the image capturing device 1004. The signal processing unit 1007 executes processing for outputting image data by executing various types of correction and compression as necessary. The signal processing unit 1007 may be formed on a semiconductor substrate on which the image capturing device 1004 is mounted, or may be formed on a semiconductor substrate different from the semiconductor substrate the image capturing device 1004 is mounted.

The photoelectric conversion system further includes a memory unit 1010 for temporarily storing image data and an external interface (I/F) unit 1013 for communicating with an external computer. Furthermore, the photoelectric conversion system includes a storage medium 1012 such as a semiconductor memory to store and read captured image data, and a storage medium control I/F unit 1011 through which data is stored in and read from the storage medium 1012. In addition, the storage medium 1012 may be built into the photoelectric conversion system, or may be attachable to and detachable from the photoelectric conversion system.

Furthermore, the photoelectric conversion system includes an overall control/calculation unit 1009 for executing various types of calculation and control of the entire digital still camera, and a timing generation unit 1008 for outputting various timing signals to the image capturing device 1004 and the signal processing unit 1007. Here, the timing signal may be input thereto from the outside. In this case, the photoelectric conversion system may include at least the image capturing device 1004 and the signal processing unit 1007 for processing the output signal output from the image capturing device 1004.

The image capturing device 1004 outputs a captured image signal to the signal processing unit 1007. The signal processing unit 1007 executes predetermined signal processing on the captured image signal output from the image capturing device 1004, and outputs image data. The photoelectric conversion system generates an image by using this image data.

As described above, according to the present exemplary embodiment, it is possible to realize a photoelectric conversion system to which the photoelectric conversion device (image capturing device) according to any one of the above-described exemplary embodiments is applied.

Fifth Exemplary Embodiment

Figure 10A:
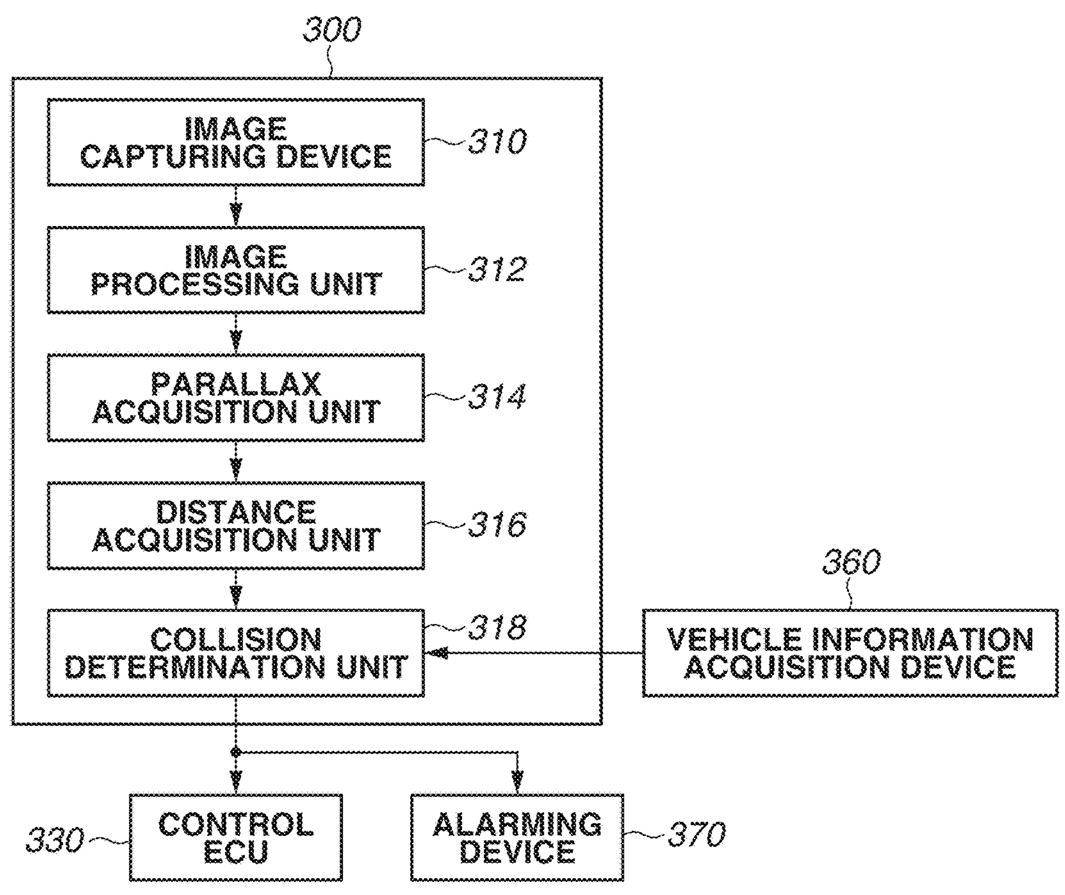
FIG. 10A is a diagram illustrating a configuration and an operation of a moving body according to a fifth exemplary embodiment.
Figure 10B:
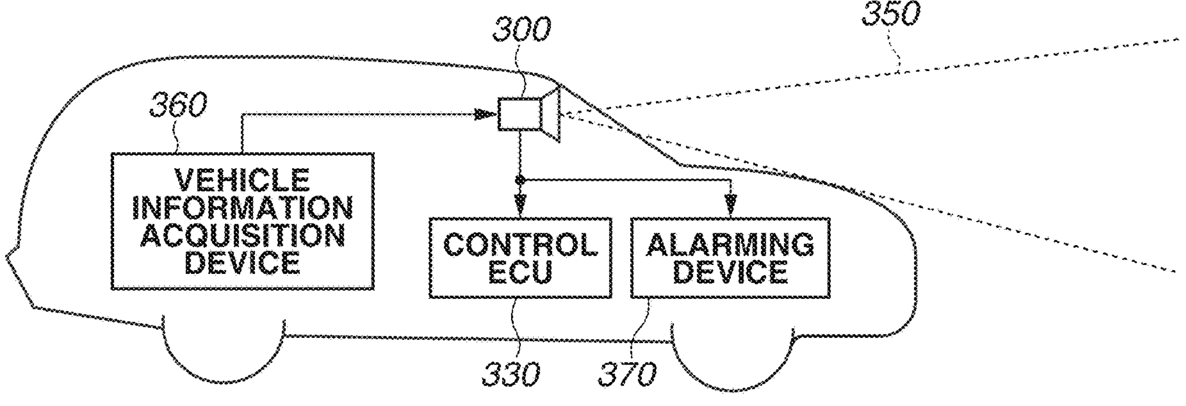
FIG. 10B is a diagram illustrating a configuration and an operation of the moving body according to the fifth exemplary embodiment.

A photoelectric conversion system and a moving body according to a present exemplary embodiment are described with reference to FIGS. 10A and 10B. FIGS. 10A and 10B are diagrams illustrating configurations of the photoelectric conversion system and the moving body according to the present exemplary embodiment.

FIG. 10A is a diagram illustrating an example of the photoelectric conversion system applied to an in-vehicle camera. A photoelectric conversion system 300 includes an image capturing device 310. The image capturing device 310 is the photoelectric conversion device (image capturing device) according to any one of the above-described exemplary embodiments. The photoelectric conversion system 300 includes an image processing unit 312 for executing image processing on a plurality of pieces of image data acquired by the image capturing device 310 and a parallax acquisition unit 314 for calculating a parallax (a phase difference of a parallax image) from the plurality of pieces of image data acquired by the photoelectric conversion system 300. The photoelectric conversion system 300 further includes a distance acquisition unit 316 for calculating a distance to a target object based on the calculated parallax and a collision determination unit 318 for determining whether there is a chance of collision based on the calculated distance. Here, the parallax acquisition unit 314 and the distance acquisition unit 316 are examples of a distance information acquisition unit which acquires distance information indicating a distance to the target object. In other words, distance information refers to information about a parallax, a defocus amount, and a distance to a target object. The collision determination unit 318 may determine a chance of collision by using any one of the pieces of distance information. The distance information acquisition unit may be implemented by hardware exclusively designed, or may be implemented by a software module. Further, the distance information acquisition unit may be implemented by a field programmable gate array (FPGA) or an application specific integrated circuit (ASIC), or may be implemented by a combination of these elements.

The photoelectric conversion system 300 is connected to a vehicle information acquisition device 360, and can acquire vehicle information such as a vehicle speed, a yaw rate, and a rudder angle. Further, the photoelectric conversion system 300 is connected to a control electronic control unit (ECU) 330 which serves as a control unit for outputting a control signal to a vehicle to make the vehicle generate braking power based on a determination result acquired by the collision determination unit 318. The photoelectric conversion system 300 is also connected to an alarming device 370 which issues a warning to a driver based on a determination result acquired by the collision determination unit 318. For example, in a case where the collision determination unit 318 acquires a determination result indicating a high chance of collision, the control ECU 330 executes vehicle control for avoiding a collision and/or reducing damages by applying a brake, releasing a gas pedal, or suppressing an engine output. The alarming device 370 issues a warning to a driver by making alarm sound, displaying alarming information on a display screen of a car navigation system, or producing vibrations in a seat belt or steering wheels.

In the present exemplary embodiment, peripheral views of the vehicle, e.g., a forward view and a backward view of the vehicle, are imaged by the photoelectric conversion system 300. FIG. 10B is a diagram illustrating a photoelectric conversion system for imaging a forward view (image capturing range 350) of the vehicle. The vehicle information acquisition device 360 issues instructions to the photoelectric conversion system 300 or the image capturing device 310. Through the above-described configuration, it is possible to further improve the range finding accuracy.

In the above-described exemplary embodiment, control which prevents a vehicle from colliding with another vehicle has been described as an example. However, the present exemplary embodiment is also applicable to control which makes a vehicle be automatically driven while following another vehicle or control which makes a vehicle be automatically driven without being drifted out of a traffic lane. Further, the photoelectric conversion system can be applied not only to a vehicle such as an automobile but also to moving bodies (moving apparatuses) such as a ship, an airplane, and an industrial robot. Furthermore, the photoelectric conversion system can widely be applied to a device such as an intelligent transportation system (ITS) which employs object recognition functions, in addition to the moving bodies.

Variation of Exemplary Embodiments

The present invention is not limited to the above-described exemplary embodiments, and various changes and modifications are possible.

For example, an exemplary embodiment in which a part of the configuration according to any one of the above-described exemplary embodiments is added to the configuration according to another exemplary embodiment or replaced with a part of the configuration according to another exemplary embodiment is also included in the exemplary embodiments of the present invention.

Further, the photoelectric conversion systems described in the fourth and fifth exemplary embodiments are merely the examples of a photoelectric conversion system to which the photoelectric conversion device can be applied, and a photoelectric conversion system to which the photoelectric conversion device according to the present invention is applicable is not limited to those illustrated in FIG. 9 and FIGS. 10A and 10B.

Furthermore, the above-described exemplary embodiments are merely the examples embodying the present invention, and shall not be construed as limiting the technical range of the present invention. In other words, the present invention can be realized in diverse ways without departing from a technical spirit or main features of the present invention.

The present invention is not limited to the above embodiments and various changes and modifications can be made within the spirit and scope of the present invention. Therefore, to apprise the public of the scope of the present invention, the following claims are made.

According to the present invention, it is possible to suppress lowering of reading speed or complicatedness of signal processing in a photoelectric conversion device capable of preferably executing analog or digital calculation, which reads out a pixel signal by using two signal processing circuits.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion device comprising:

a pixel array on which a plurality of pixels including a first pixel and a second pixel, each of which includes a photoelectric conversion portion, is arranged, wherein at least part of the pixels included in the pixel array are pixels which output signals used for focus detection, each of which includes a photoelectric conversion portion partially shielded from light and arranged with respect to one microlens, wherein the first pixel is connected to a first signal processing circuit via a first signal line, wherein the second pixel is connected to a second signal processing circuit via a second signal line, wherein, in a planar view the pixel array is viewed from an upper face of the pixel array and the photoelectric conversion device has a portion at which a third signal line extending from the first signal line to the first signal processing circuit intersects with the second signal line, wherein the pixel array, the first signal line, and the second signal line are arranged on a first semiconductor substrate, wherein the first signal processing circuit and the second signal processing circuit are arranged on a second semiconductor substrate, wherein the first signal line and the first signal processing circuit are connected via a first bonded portion, wherein the second signal line and the second signal processing circuit are connected via a second bonded portion, and wherein the third signal line between the first bonded portion and the first signal processing circuit intersects with the second signal line in the planar view.

2. The photoelectric conversion device according to claim 1, wherein, in the planar view, the photoelectric conversion device has a portion at which a fourth signal line extending from the second signal line to the second signal processing circuit intersects with the first signal line.

3. The photoelectric conversion device according to claim 1, wherein each of the first bonded portion and the second bonded portion is formed to include an electrode penetrating the first semiconductor substrate and the second semiconductor substrate.

4. The photoelectric conversion device according to claim 1, wherein an insulating body of the first semiconductor substrate and an insulating body of the second semiconductor substrate are bonded at a bonded face, and wherein each of the first bonded portion and the second bonded portion is formed of a metal of the first semiconductor substrate and a metal of the second semiconductor substrate bonded at the bonded face.

5. The photoelectric conversion device according to claim 1, wherein a detection unit for executing focus detection by using signals output from the plurality of photoelectric portions is arranged on the second semiconductor substrate.

6. The photoelectric conversion device according to claim 1, wherein a first color filter for covering the first pixel and a second color filter for covering the second pixel correspond to different colors.

7. A photoelectric conversion system comprising:

the photoelectric conversion device according to claim 1; and a signal processing unit configured to generate an image by using signals output from the photoelectric conversion device.

8. A moving body including the photoelectric conversion device according to claim 1, the moving body comprising a control unit configured to control movement of the moving body by using a signal output from the photoelectric conversion device.

9. The photoelectric conversion device according to claim 1, wherein, when a direction in which the first pixel and the second pixel are arranged is a positive direction of a first direction, a direction, in which one of arrangement positions of the first bonded portion and the second bonded portion is viewed from another one of the arrangement positions of the first bonded portion and the second bonded portion, includes a component of a negative direction of the first direction.

10. The photoelectric conversion device according to claim 9, wherein a direction in which the first signal processing circuit and the second signal processing circuit are arranged includes a component of a second direction orthogonal to the first direction.

11. The photoelectric conversion device according to claim 1, wherein the photoelectric conversion device includes a plurality of structure layers including a first structure layer and a second structure layer between the first semiconductor substrate and the second semiconductor substrate, wherein the first structure layer is arranged between the first semiconductor substrate and the second structure layer, and the second structure layer is arranged between the first semiconductor substrate and the second semiconductor substrate, and wherein the photoelectric conversion device includes a bonded portion at which a first conductive portion included in the first structure layer and a second conductive portion included in the second structure layer are bonded together.

12. The photoelectric conversion device according to claim 11, wherein a first plurality of interlayer connection portions formed of a conductive material is connected to the first conductive portion, and wherein a second plurality of interlayer connection portions formed of a conductive material is connected to the second conductive portion.

13. The photoelectric conversion device according to claim 11, wherein the photoelectric conversion device further includes a bonded portion different from the bonded portion, and wherein the different bonded portion and the bonded portion are connected to one wiring layer included in the first structure layer.

14. The photoelectric conversion device according to claim 11, wherein the photoelectric conversion device further includes a bonded portion different from the bonded portion, and wherein the different bonded portion and the bonded portion are connected to one wiring layer included in the second structure layer.

15. The photoelectric conversion device according to claim 1, wherein the photoelectric conversion device executes arithmetic processing on signals read from the first signal line and signals read from the second signal line.

16. The photoelectric conversion device according to claim 15, wherein the arithmetic processing is addition processing.

* * * * *